(12) United States Patent
Son et al.

(10) Patent No.: US 10,490,449 B2
(45) Date of Patent: Nov. 26, 2019

(54) TECHNIQUES FOR REVEALING A BACKSIDE OF AN INTEGRATED CIRCUIT DEVICE, AND ASSOCIATED CONFIGURATIONS

(71) Applicant: Intel Corporation, Santa Clara, CA (US)

(72) Inventors: Il-Seok Son, Portland, OR (US); Colin T. Carver, Hillsboro, OR (US); Paul B. Fischer, Portland, OR (US); Patrick Morrow, Portland, OR (US); Kimin Jun, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/753,124

(22) PCT Filed: Sep. 24, 2015

(86) PCT No.: PCT/US2015/052001
§ 371 (c)(1),
(2) Date: Feb. 15, 2018

(87) PCT Pub. No.: WO2017/052558
PCT Pub. Date: Mar. 30, 2017

(65) Prior Publication Data
US 2018/0233409 A1    Aug. 16, 2018

(51) Int. Cl.
*H01L 21/768* (2006.01)
*H01L 21/304* (2006.01)
(Continued)

(52) U.S. Cl.
CPC ...... *H01L 21/76898* (2013.01); *H01L 21/304* (2013.01); *H01L 21/30608* (2013.01);
(Continued)

(58) Field of Classification Search
None
See application file for complete search history.

(56) References Cited

U.S. PATENT DOCUMENTS 6,037,822 A *  3/2000  Rao ................. H01L 23/481
                                                   257/698
8,691,664 B2    4/2014  Yang et al.
(Continued)

FOREIGN PATENT DOCUMENTS

KR    10-0844938 B1    7/2008

OTHER PUBLICATIONS

International Search Report and Written Opinion dated Jun. 20, 2016 for International Application No. PCT/US2015/052001, 9 pages.

*Primary Examiner* — Steven B Gauthier
(74) *Attorney, Agent, or Firm* — Schwabe, Williamson & Wyatt, P.C.

(57) ABSTRACT

Embodiments of the present disclosure describe techniques for revealing a backside of an integrated circuit (IC) device, and associated configurations. The IC device may include a plurality of fins formed on a semiconductor substrate (e.g., silicon substrate), and an isolation oxide may be disposed between the fins along the backside of the IC device. A portion of the semiconductor substrate may be removed to leave a remaining portion. The remaining portion may be removed by chemical mechanical planarization (CMP) using a selective slurry to reveal the backside of the IC device. Other embodiments may be described and/or claimed.

9 Claims, 7 Drawing Sheets (51) Int. Cl.
*H01L 21/84* (2006.01)
*H01L 21/306* (2006.01)
*H01L 25/065* (2006.01)
*H01L 27/088* (2006.01)
*H01L 29/06* (2006.01)

(52) U.S. Cl.
CPC ...... *H01L 21/30625* (2013.01); *H01L 21/845* (2013.01); *H01L 25/0657* (2013.01); *H01L 27/0886* (2013.01); *H01L 29/0649* (2013.01); *H01L 21/84* (2013.01)

(56) References Cited

U.S. PATENT DOCUMENTS

| | | | |
|---|---|---|---|
| 2006/0121690 A1* | 6/2006 | Pogge | H01L 21/6835 438/455 |
| 2007/0117348 A1 | 5/2007 | Ramanathan et al. | |
| 2013/0189828 A1 | 7/2013 | Ahn et al. | |
| 2014/0008757 A1 | 1/2014 | Ramachandran et al. | |
| 2014/0167172 A1* | 6/2014 | Chen | H01L 29/6681 257/368 |
| 2015/0235922 A1* | 8/2015 | Chen | H01L 23/481 257/383 |
| 2016/0181395 A1* | 6/2016 | Liu | H01L 29/66545 257/347 |

* cited by examiner

TECHNIQUES FOR REVEALING A BACKSIDE OF AN INTEGRATED CIRCUIT DEVICE, AND ASSOCIATED CONFIGURATIONS

CROSS REFERENCE TO RELATED APPLICATIONS

The present application is a national phase entry under 35 U.S.C. § 371 of International Application No. PCT/US2015/052001, filed Sep. 24, 2015, entitled "TECHNIQUES FOR REVEALING A BACKSIDE OF AN INTEGRATED CIRCUIT DEVICE, AND ASSOCIATED CONFIGURATIONS", which designated, among the various States, the United States of America. The disclosure of International Application No. PCT/US2015/052001 is hereby incorporated by reference in its entirety.

FIELD

Embodiments of the present disclosure generally relate to the field of integrated circuits, and more particularly, to techniques for revealing the backside of an integrated circuit device and associated configurations.

BACKGROUND

In three-dimensional integrated circuit (IC) devices, it may be necessary to access the device layer of the IC device from both the front side and backside of the IC device. However, the density of vias that may be included in the backside of the IC device is inversely proportional to the thickness of the substrate (e.g., silicon substrate) on the backside of the IC device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe techniques for revealing a backside of an integrated circuit (IC) device and associated configurations. The IC device may include a plurality of fins formed on a semiconductor substrate (e.g., silicon substrate), and an isolation oxide may be disposed between the fins along the backside of the IC device. A portion of the semiconductor substrate may be removed to leave a remaining portion. For example, a first portion of the semiconductor substrate may be removed by mechanical grinding, and a second portion of the semiconductor substrate may be removed by wet etch to leave the remaining portion. The remaining portion of the semiconductor substrate may be removed by chemical mechanical planarization (CMP) using a selective slurry to reveal the backside of the IC device.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Figure 1:
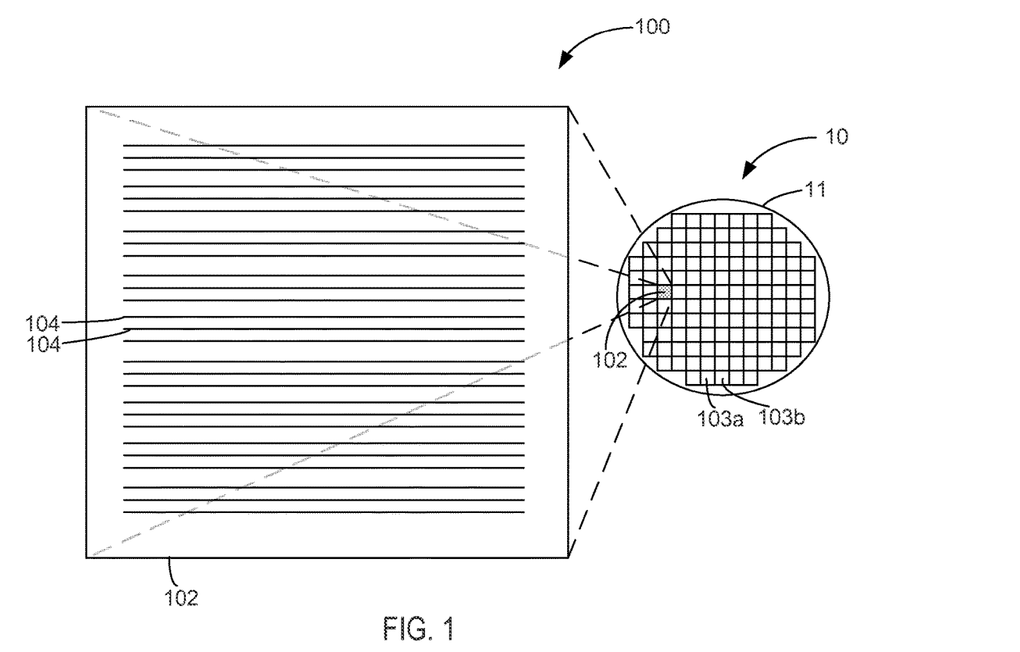
FIG. 1 schematically illustrates a top view of an example die in wafer form and in singulated form, in accordance with some embodiments.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality. FIG. 1 schematically illustrates a top view of an example die 102 in wafer form 10 and in singulated form 100, in accordance with some embodiments. In some embodiments, the die 102 may be one of a plurality of dies (e.g., dies 102, 103a, 103b) of a wafer 11 composed of semiconductor material such as, for example, silicon or other suitable material. The plurality of dies may be formed on a surface of the wafer 11. Each of the dies may be a repeating unit of a semiconductor product that includes one or more IC devices (e.g., IC device 410 of FIGS. 4A-4D and/or FIGS. 5A-5C) as described herein.

For example, the die 102 may include circuitry having transistor structures 104 such as, for example, one or more channel bodies (e.g., fin structures, nanowires, planar bodies, etc.) that provide a channel pathway for mobile charge carriers of one or more transistor devices or source/drain regions. Electrical interconnect structures such as, for example, transistor electrode assemblies (e.g., terminal contacts) may be formed on and coupled with the one or more transistor structures 104 to route electrical energy to or from the transistor structures 104. For example, terminal contacts may be electrically coupled with a channel body to provide a gate electrode for delivery of a threshold voltage and/or a source/drain current to provide mobile charge carriers for operation of a transistor device. Although the transistor structures 104 are depicted in rows that traverse a substantial portion of the die 102 in FIG. 1 for the sake of simplicity, it is to be understood that the transistor structures 104 may be configured in any of a wide variety of other suitable arrangements on the die 102 in other embodiments, including, for example, vertical and horizontal features having much smaller dimensions than depicted.

After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the transistor structures 104 may be disposed on a semiconductor substrate in wafer form 10 or singulated form 100. The transistor structures 104 described herein may be incorporated in a die 102 for logic or memory, or combinations thereof. In some embodiments, the transistor structures 104 may be part of a system-on-chip (SoC) assembly.

Figure 2:
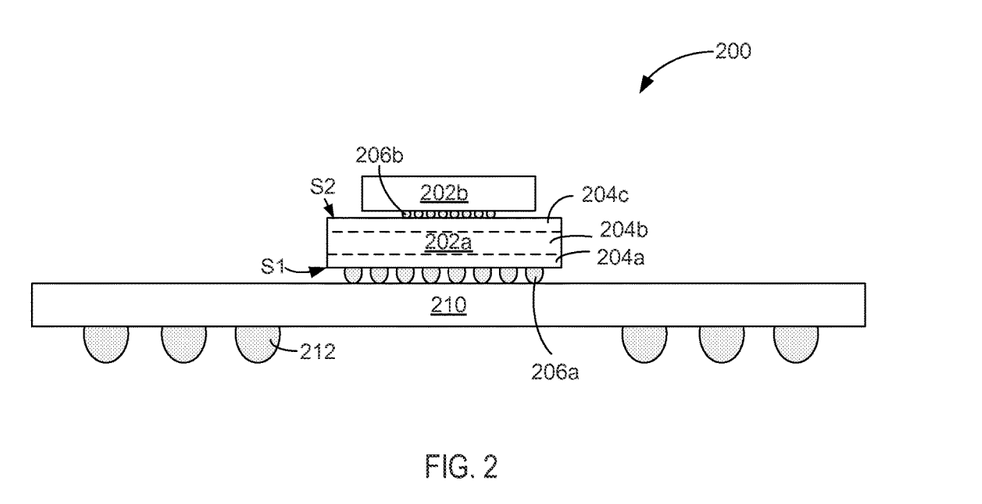
FIG. 2 schematically illustrates a cross-section side view of an integrated circuit (IC) assembly, in accordance with some embodiments.

FIG. 2 schematically illustrates an example cross-section side view of an IC package assembly 200, in accordance with some embodiments. The IC package assembly 200 represents one example stacked configuration of a first die 202a coupled with a package substrate 210 using die-level interconnects 206a and a second die 202b coupled with the first die 202a using die-level interconnects 206b, according to various embodiments. The die 202a and/or die 202b may correspond to the die 102 of FIG. 1.

In various embodiments, the die 202a may include a first side S1 and a second side S2 opposite the first side S1. In some embodiments, the first side S1 may be referred to as a "front side" of the die 202a, and the second side S2 may be referred to as a "backside" of the die 202a, although in other embodiments the first side S1 may be the backside and the second side S2 may be the front side. The backside of the die 202a may be the side of the die 202a on which the semiconductor substrate is disposed during fabrication of the die 202a. However, as further discussed herein, the semiconductor substrate may be removed during fabrication and thus not present in the fabricated die 202a.

In some embodiments, the die 202a may generally include one or more device layers (hereinafter "device layer 204b"), one or more interconnect layers (hereinafter "interconnect layer 204a") disposed on the first side S1 of the die 202a, and one or more interconnect layers (hereinafter "interconnect layer 204c") disposed on the second side S2 of the die 202a. The device layer 204b may represent a region where active devices such as transistor devices are formed on the semiconductor substrate. The device layer 102b may include, for example, transistor structures such as channel bodies and/or source/drain regions of transistor devices. The interconnect layers 204a and/or 204c may include interconnect structures (e.g., electrode terminals) that are configured to route electrical signals to or from the active devices in the device layer 204b. For example, the interconnect layers 204a and/or 204c may include horizontal lines (e.g., trenches) and/or vertical plugs (e.g., vias) or other suitable features to provide electrical routing and/or contacts. The interconnect layers 204a and/or 204c may additionally or alternatively include one or more through vias (sometimes referred to as through-silicon vias (TSVs) in devices that include a silicon substrate) that extend from the first side S1 to the second side S2 of the die 202a to route signals between the die 202b and the package substrate 210.

The die 202a and/or die 202b may represent a discrete product made from a semiconductor material (e.g., silicon) using semiconductor fabrication techniques such as thin film deposition, lithography, etching and the like used in connection with forming complementary metal-oxide-semiconductor (CMOS) devices. In some embodiments, the die 102 may be, include, or be a part of a processor, memory, system-on-chip (SoC) or application-specific IC (ASIC). In some embodiments, an electrically insulative material such as, for example, molding compound or underfill material (not shown) may encapsulate at least a portion of the die 202a and/or die-level interconnect structures 206.

In some embodiments, the first die 202a may include a processor and the second die 202b may include memory. The first die 202a and/or the second die 202b may be configured to perform other functions in other embodiments. For example, in some embodiments, the first die 202a may be configured to function as memory, an application specific integrated circuit (ASIC), processor, or combinations thereof.

In the depicted configuration, the first die 202a is coupled with the package substrate 210 in a flip-chip configuration and the second die 202b is coupled with the first die 202a in a flip-chip configuration. The IC package assembly 200 is not limited to the configuration depicted in FIG. 2 and may include a wide variety of other suitable configurations in other embodiments. For example, in some embodiments additional dies may be stacked on the second die 202b and/or the first die 202a may be coupled with a component other than the package substrate 210. The IC package assembly 200 may include, for example, combinations of flip-chip and wire-bonding techniques, interposers, multi-chip package configurations including SoC and/or package-on-package (PoP) configurations to route electrical signals in some embodiments.

Figure 6:
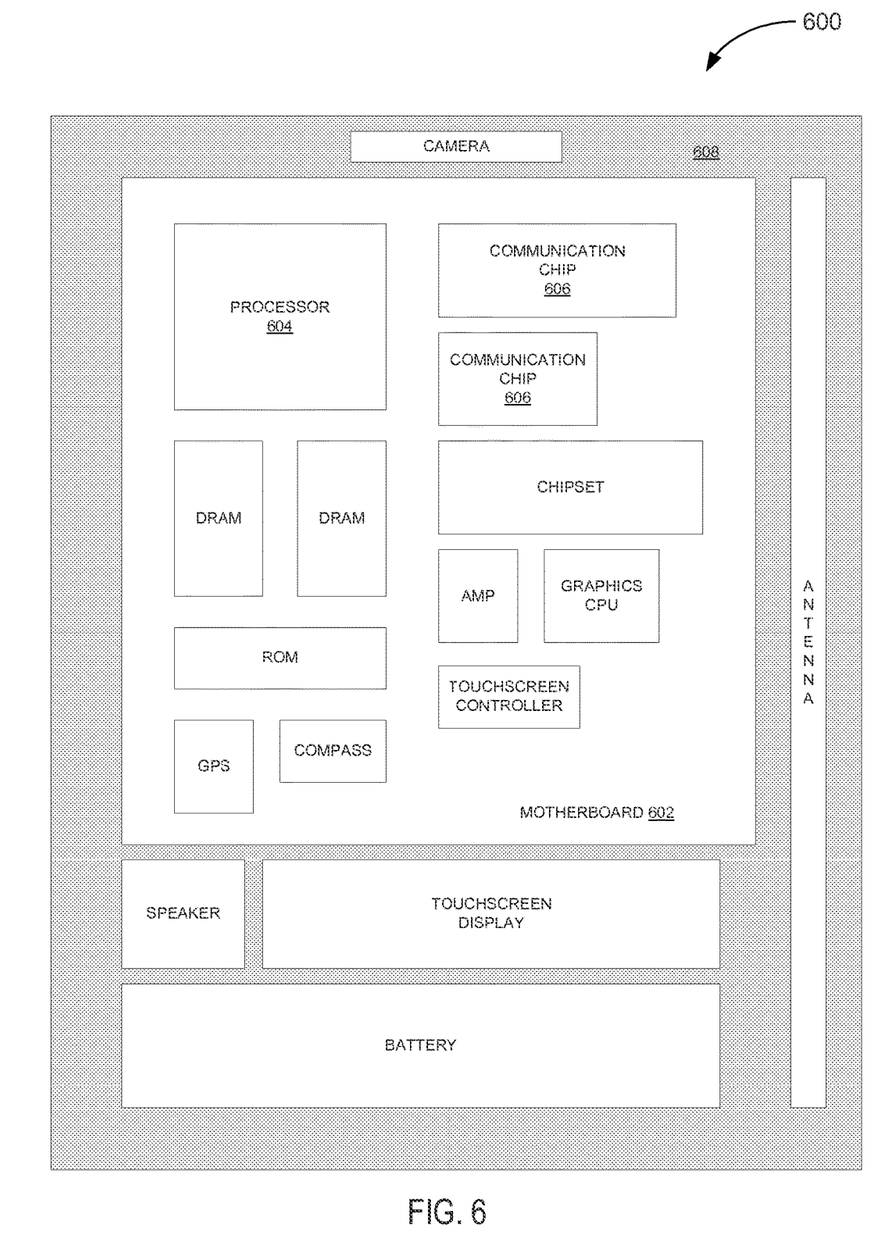
FIG. 6 schematically illustrates an example system that may include an IC device as described herein, in accordance with some embodiments.

In some embodiments, the IC package assembly 200 may include package interconnects 212 configured to route electrical signals between the first die 202a (and/or the second die 202b) and other electrical components external to the IC package assembly 200 including, for example, a circuit board such as a motherboard (e.g., motherboard 602 of FIG. 6). According to various embodiments, the package substrate 210 may be composed of a polymer, ceramic, glass, or semiconductor material having electrical routing features formed therein to electrically couple the die-level interconnects 206a and the package interconnects 212. The electrical routing features may include, for example, pads or traces (not shown) disposed on one or more surfaces of the package substrate 210 and/or internal routing features (not shown) such as, for example, trenches, vias or other interconnect structures to route electrical signals through the package substrate 210. For example, in some embodiments, the package substrate 210 may include electrical routing features such as pads (not shown) configured to receive the respective die-level interconnects 206a of the die 202a.

The interconnects 206a, 206b, 212 may include any of a wide variety of suitable structures and/or materials including, for example, bumps, pillars or balls formed using metals, alloys, solderable material, or combinations thereof. The interconnects 206a, 206b, 212 may include other suitable structures and/or materials in other embodiments. The interconnects 206a may be electrically coupled with the interconnect layer 204a to route electrical signals between the die 202a and other electrical devices (e.g., via the package substrate 210). The interconnects 206b may be electrically coupled with the interconnect layer 204c to route electrical signals between the die 202a and the die 202b. The electrical signals may include, for example, input/output (I/O) signals and/or power/ground signals that are used in connection with operation of the die 202a and/or die 202b.

Figure 3:
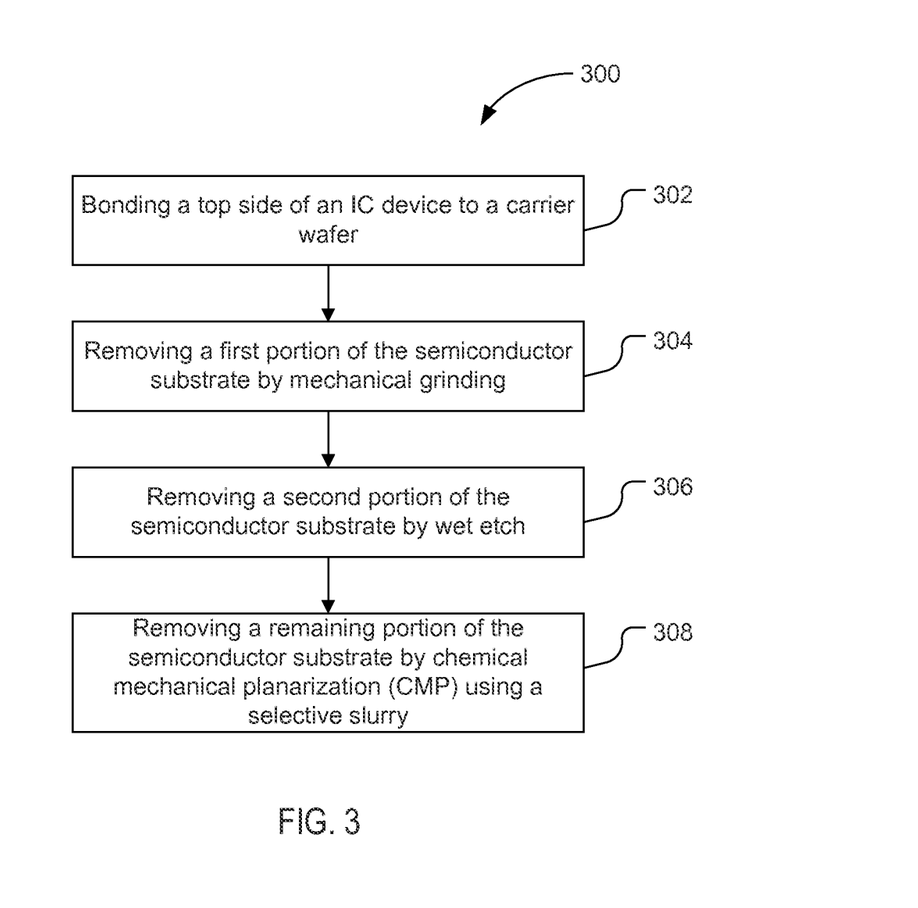
FIG. 3 is a flow diagram that illustrates a backside reveal process for removing a semiconductor substrate from a backside of an IC device, in accordance with some embodiments.

FIG. 3 is an illustrative flow diagram of a backside reveal process 300 (hereinafter "process 300") that may be performed to remove a semiconductor substrate from a backside of an IC device, in accordance with various embodiments. In some embodiments, some or all of the process 300 may be performed on a semiconductor wafer that includes a plurality of IC devices disposed thereon.

FIGS. 4A, 4B, 4C, and 4D schematically illustrate a cross-sectional side view of a circuit structure 400 at various stages of the process 300, in accordance with various embodiments. Accordingly, the process 300 will be described below with reference to FIGS. 4A-4D Referring to FIG. 4A, the circuit structure 400 may include a device layer 402 that forms a plurality of IC devices 410 having a backside 404 and a front side 406. The front side 406 may be coupled to a semiconductor substrate 408. The semiconductor substrate 408 may be a wafer in some embodiments. The semiconductor substrate 408 may be substantially composed of a bulk semiconductor material such as, for example, silicon in some embodiments.

Figures 4A, 4B, 4C:
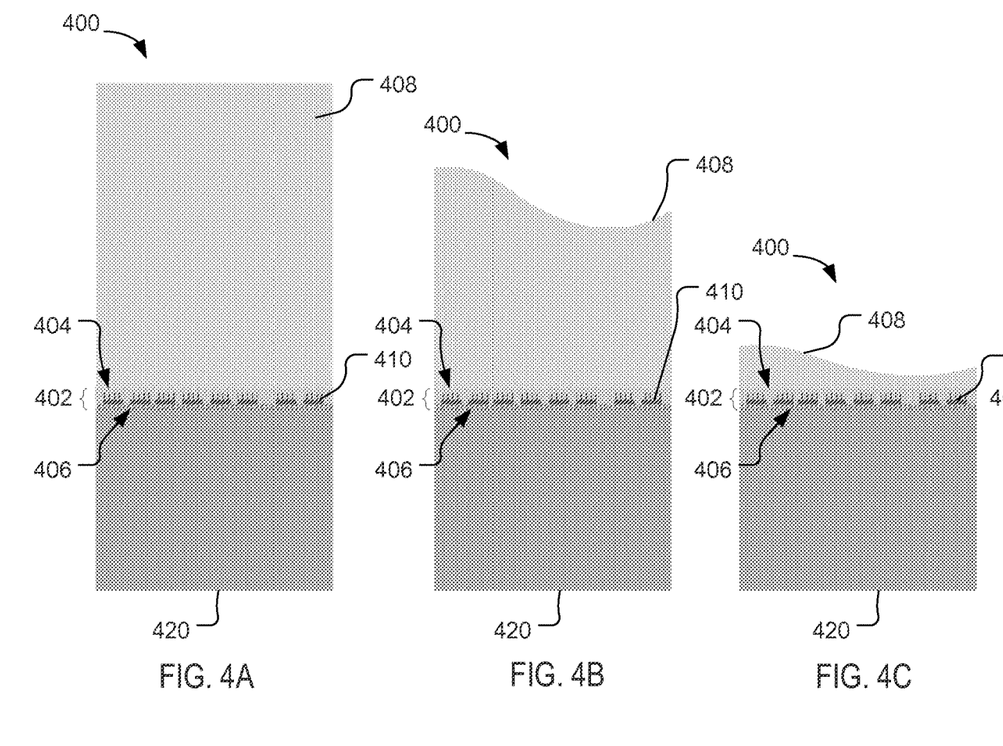
FIGS. 4A-4D schematically illustrate a cross-section side view of an IC device during various stages of the backside reveal process of FIG. 3, in accordance with some embodiments.

The device layer 402 may form a plurality of IC devices 410. The device layer 402 may correspond to a region where active devices such as transistor devices are formed on the semiconductor substrate 408. The device layer 402 may include, for example, transistor structures such as channel bodies and/or gate/source/drain regions of transistor devices.

Figure 5A:
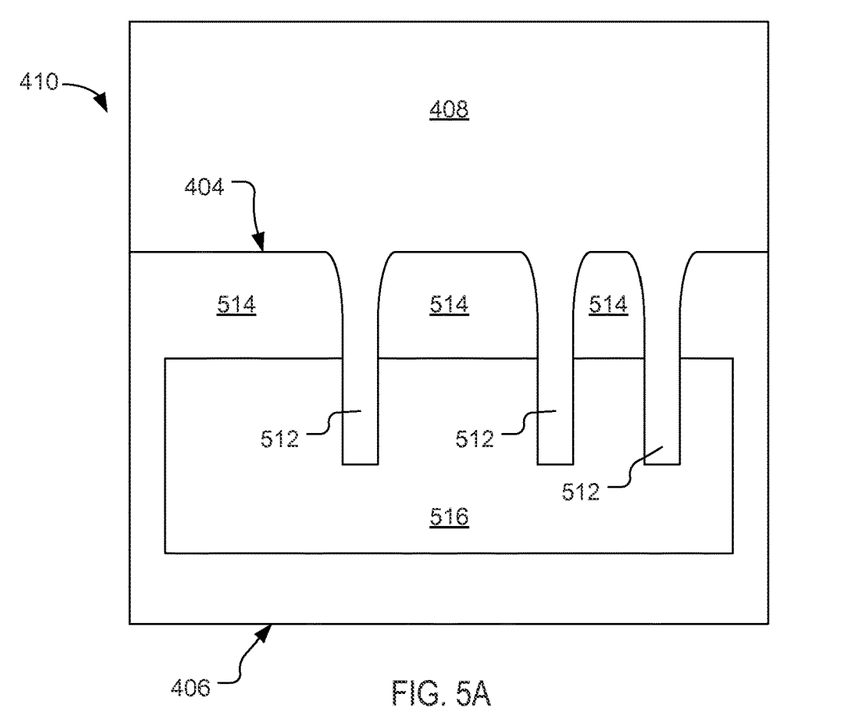
FIG. 5A schematically illustrates a cross-section side view of an IC device formed on a semiconductor substrate, in accordance with some embodiments.

FIG. 5A illustrates a closer side cross-sectional view of an IC device 410 formed on a substrate 408, in accordance with various embodiments. The IC device 410 may include one or more fins 512 that extend from the backside 404 of IC device 410 (e.g., into the body of the IC device 410). The fins 512 may extend substantially perpendicular from the backside 404 and/or the substrate 408, and may be laterally separated from one another. The fins 512 may be formed of a semiconductor material, such as silicon. For example, in some embodiments, the fins 512 may be formed from the substrate 408.

Alternatively, or additionally, in some embodiments, the fins 512 may include one or more nanowires of semiconductor material. In embodiments in which the fins 512 include a plurality of nanowires of semiconductor material, the nanowires may be stacked on top of one another. In some embodiments, the nanowires of a fin 512 may be separated from one another by a dielectric material. The nanowires may include and/or be coupled with a gate oxide and/or a gate metal.

The IC device 410 may further include an isolation oxide 514 coupled to the substrate 408 between the fins 512. The isolation oxide 410 may be any suitable insulating material, such as silicon oxide ($SiO_2$), silicon oxynitride ($SiO_xN_y$), silicon nitride ($Si_xN_y$), aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), carbon doped oxide (CDO), silicon nitride (SiN), or combinations thereof, where x, y, and z represent suitable quantities of the respective elements. The isolation oxide 410 may define the backside 404 of the IC device 410.

In various embodiments, the IC device 410 may further include transistor structures 516 coupled to one or more of the fins 512. The transistor structures 516 may include a plurality of transistor layers that form one or more transistors with the fins 512. For example, the fins 512 may form a channel region of the transistors, and the transistor structures 516 may form another portion of the channel region and/or gate/source/drain regions of the transistors. It will be appreciated that the transistor structures 516 may include any suitable material layers to form the transistors with the fins 512. For example, the transistor structures 516 may include one or more semiconductor layers, oxide layers, dielectric layers, insulator layers, and/or metal layers.

In some embodiments, the isolation oxide 514 may substantially surround the transistor structures 516, as shown. One or more vias (not shown) may be disposed in the isolation oxide 514 (e.g., from the backside 404 or front side 406) to electrically connect one or more of the transistor structures 516 to other components.

Although the backside reveal techniques described herein are described with reference to fin field-effect transistors (finFETs), the backside reveal techniques may be applied to IC devices that include other types of transistors, in accordance with various embodiments. For example, in some embodiments, the IC devices may include planar transistors. Such IC devices may include shallow trench isolation (STI) regions that separate semiconductor regions. The STIs may be formed in the semiconductor substrate by etching into the substrate to form recesses and filling the recesses with an isolation oxide. The semiconductor regions may be doped semiconductor wells, such as n-type doped wells (e.g., to form p-type transistors) or p-type doped wells (e.g., to form n-type transistors). The semiconductor substrate below the STI regions and doped semiconductor wells may be removed as described herein. Accordingly, the backside of the IC device may include the doped semiconductor portions separated by the STI regions.

Alternatively, in some embodiments, the IC devices may be formed on a silicon-on-insulator wafer that includes an insulator layer (e.g., an isolation oxide) disposed on the silicon substrate. A semiconductor layer (e.g., silicon) and other transistor layers may be formed on the insulator layer to form one or more transistors. In various embodiments, the semiconductor substrate may be removed using the insulator layer as an etch stop layer. Accordingly, the insulator layer may be exposed and may define the backside of the IC device.

Referring again to FIG. 3, at 302, the process 300 may include bonding a top side, of IC devices that are disposed on a semiconductor substrate wafer, to a carrier wafer. For example, FIG. 4A illustrates the circuit structure 400 with a carrier wafer 420 bonded to the top side 406 of the IC devices 410. The IC devices 410 may be formed on the semiconductor substrate 408 with the top side 406 facing up, and the wafer of IC devices 410 may then be flipped and bonded to the carrier wafer 420 with the top side 406 facing down.

The carrier wafer may be any suitable material, such as silicon. The carrier wafer may be bonded to the top side 406 of the IC devices 410 by any suitable mechanism, such as oxide fusion bonding, metallic bonding, or adhesive bonding. Additionally, the carrier wafer may be temporarily or permanently bonded to the IC devices 410. By temporarily bonded, it is meant that the carrier wafer is removed after the process 300 is performed. By permanently bonded, it is meant that the carrier wafer remains bonded to the IC devices 410 in their final form (e.g., when the IC device 410 is incorporated into an IC package such as IC package 200). In some embodiments, the carrier wafer may include routing features to route electrical signals between the IC device 410 and one or more other devices.

At 304, the process 300 may include removing a first portion of the semiconductor substrate (e.g., of the semiconductor substrate wafer), for example, by mechanical grinding. FIG. 4B illustrates the circuit structure 400 after mechanical grinding has been performed on the semiconductor substrate 408. The mechanical grinding may reduce a thickness of the semiconductor substrate (e.g., in a dimension perpendicular from the backside of the IC device) from a first thickness to a second thickness. In one non-limiting example, the first thickness may be about 775 micrometers (μm), and the second thickness may be about 5 to 10 μm. The second thickness may vary across the surface of the semiconductor substrate. Any suitable method or machinery may be used for mechanical grinding at 304. For example, the semiconductor substrate may be brought into contact with a rotating grinding wheel. In some embodiments, the wafer including the semiconductor substrate may be rotated in addition to, or instead of, rotating the grinding wheel. The surface of the grinding wheel may be abrasive and/or otherwise configured to remove the semiconductor material from the substrate layer.

At 306, the process 300 may include removing a second portion of the semiconductor substrate, for example, by an etching process such as by wet etch. FIG. 4C illustrates the circuit structure 400 after a wet etch has been performed on the semiconductor substrate 408. The wet etch may remove the second portion of the semiconductor substrate to leave a remaining portion of the semiconductor substrate. For example, the wet etch may reduce a thickness of the semiconductor substrate from the second thickness to a third thickness. In one non-limiting example, the third thickness may be about 0.5 to 2 μm. The second thickness may not be uniform across the surface of the semiconductor substrate. Any suitable method or machinery may be used to perform the wet etch at 306. For example, the wafer may be placed in an etching chamber, where the semiconductor substrate is exposed to an etchant (e.g., by a spray tool) to remove the second portion of the semiconductor substrate. In some embodiments, for etching blanket layers of silicon, the etch process may use one or more silicon etchants, such as tetramethylammonium hydroxide (TMAH), hydrofluoric (HF) acid, nitric acid, and/or acetic acid.

Figure 4D:
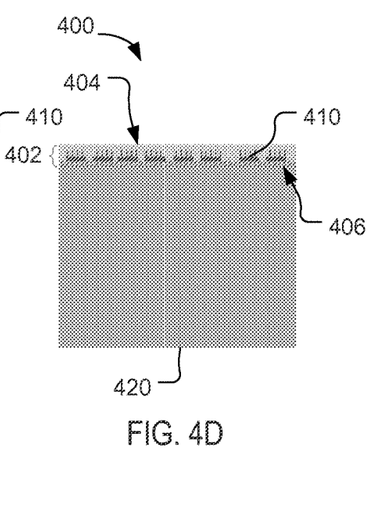

At 308, the process 300 may include removing a remaining portion of the semiconductor substrate, for example, by CMP using a selective slurry. FIG. 4D illustrates the circuit structure 400 after the CMP has been performed to remove the remaining portion of the semiconductor substrate 408. The CMP may expose the backside 404 of the IC devices 410.

As part of the CMP process, the selective slurry may be applied to the surface of the semiconductor substrate, and a polishing pad may apply pressure to the selective slurry and/or the surface of the semiconductor substrate. The polishing pad may be rotated to promote even distribution of the slurry and generate a substantially smooth resulting surface (e.g., on the backside of the IC device). The selective slurry may be highly selective for the material of the semiconductor substrate (e.g., silicon) compared with the isolation oxide. Accordingly, the slurry may be corrosive to the semiconductor substrate to remove the semiconductor substrate from the backside of the IC devices. However, the slurry may not be corrosive to the isolation oxide, and thus the CMP process may leave the structure of the isolation oxide substantially intact.

Although the method 300 is described as using grinding, wet etch, and then CMP to remove the semiconductor substrate from the backside of the IC devices, other embodiments may include other techniques to remove the semiconductor substrate. For example, in some embodiments, the entire semiconductor substrate may be removed by CMP. In other embodiments, a first portion of the semiconductor substrate may be removed by grinding and then a remaining portion of the semiconductor substrate may be removed by CMP. In other embodiments, a first portion of the semiconductor substrate may be removed by wet etch and then a remaining portion of the semiconductor substrate may be removed by CMP.

Figure 5B:
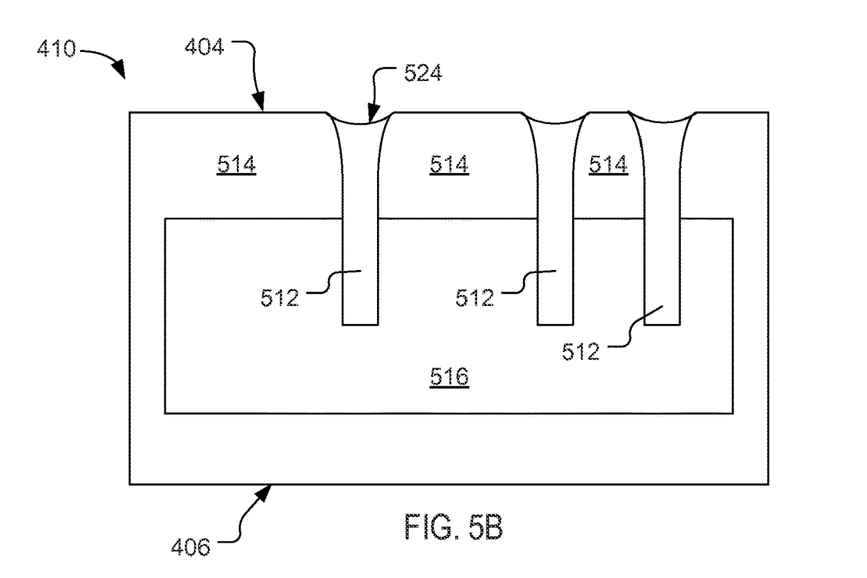
FIG. 5B schematically illustrates a cross-section side view of the IC device of FIG. 5A with the semiconductor substrate removed by a backside reveal process, in accordance with some embodiments.

Since the fins of the IC devices may be formed of the same material as the semiconductor substrate (e.g., silicon), a portion of the fins along the backside of the IC devices may also be removed by the CMP process. For example, FIG. 5B illustrates the IC device 410 after the CMP process is performed to remove the semiconductor substrate 408, in accordance with some embodiments. A surface 524 of the fins 512 along the backside 404 may be a dished (e.g., curved) surface that is recessed from a plane of the backside 404 that is defined by the isolation oxide 514.

In some embodiments, the fins 512 may be further recessed such that the surface 524 of the fins 512 is recessed from the surface of the isolation oxide 514. The fins 512 may be recessed, for example, by CMP, wet etch, dry etch, and/or another suitable process.

Figure 5C:
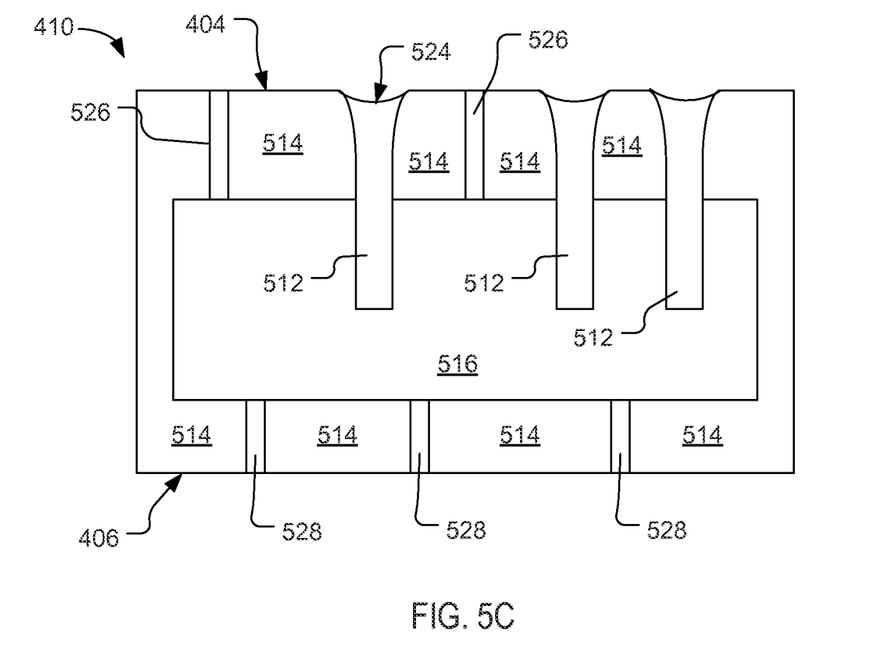
FIG. 5C schematically illustrates a cross-section side view of the IC device of FIG. 5B including backside vias and front side vias, in accordance with some embodiments.

In various embodiments, after the semiconductor substrate is removed by the CMP process, vias may be formed in the backside of the IC devices to provide an electrical connection to one or more layers of the IC device (e.g., to one or more transistor layers). For example, FIG. 5C illustrates the IC device 410 with backside vias 526 formed in the backside 404 of the IC device 410. The backside vias 526 may extend from the backside 404 of the IC device 410 into the body of the IC device (e.g., to one or more layers of the transistor structures 516). The backside vias 526 may include a metal to provide a conductive path to the transistor structures 516 and/or through the IC device 410.

Vias typically include a width that narrows as the via extends into the IC device. The removal of the semiconductor substrate may allow the backside vias (e.g., backside vias 526) to be shorter compared with vias that pass through a substrate layer. Accordingly, the width of the vias at the backside of the IC device may be lower than for vias in an IC device that includes a substrate on the backside of the IC device, thereby allowing a higher density of backside vias to be formed in the backside of the IC device.

As illustrated in FIG. 5C, the IC device 410 may further include front side vias 528 formed in the front side 406 of the IC device 410. The front side vias 528 may extend from the front side 406 into the body of the IC device 410 to provide a conductive path to one or more layers of the IC device 410 and/or to provide a conductive path through the IC device 410. In some embodiments, the front side vias 528 may be formed in the IC device 410 prior to the removal of the semiconductor substrate 408. Alternatively, the front side vias 528 may be formed in the IC device 410 after the semiconductor substrate 408 is removed.

Figure 5D:
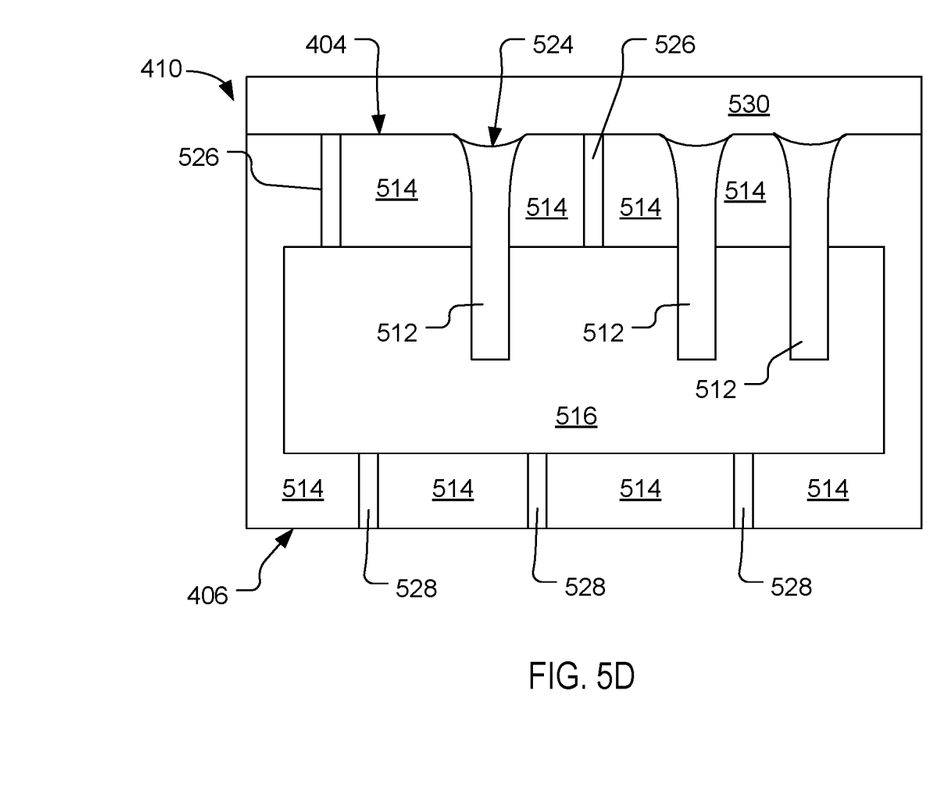
FIG. 5D schematically illustrates a cross-section side view of the IC device of FIG. 5C with an interconnect layer coupled to the backside of the IC device, in accordance with some embodiments.

In some embodiments, further structures may be formed on the backside of the IC device after the semiconductor substrate is removed. For example, one or more interconnect layers (such as interconnect layer 204c shown in FIG. 2) may be formed on the backside of the IC device after the semiconductor substrate is removed. FIG. 5D illustrates the IC device 410 with an interconnect layer 530 coupled to the backside 404 of the IC device 410, in accordance with some embodiments. The interconnect layer 530 may route signals to or from the one or more transistors (e.g., transistor structures 516) of the IC device 410 via the one or more vias 526. No semiconductor substrate may be between the interconnect layer 530 and the isolation oxide 514.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

FIG. 6 schematically illustrates an example system (e.g., computing device 600) that may include an IC device (e.g., IC device 410) as described herein, in accordance with some embodiments. Components of the computing device 600 may be housed in an enclosure (e.g., housing 608). The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

Depending on its applications, computing device 600 may include other components that may or may not be physically and electrically coupled to the motherboard 602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, EV-DO, and others.

The processor 604 of the computing device 600 may include a die (e.g., die 102 of FIG. 1, die 202a of FIG. 2, and/or die 202b of FIG. 2) having an IC device (e.g., IC device 410) as described herein. For example, the die 202a of FIG. 2 may be mounted in a package assembly (e.g., package assembly 200) that is mounted on a circuit board such as the motherboard 602. The term "processor" may refer to any device or portion of a device that processes electronic data from registers and/or memory to transform that electronic data into other electronic data that may be stored in registers and/or memory.

The communication chip 606 may also include a die (e.g., die 102 of FIG. 1, die 202a of FIG. 2, and/or die 202b of FIG. 2) having an IC device (e.g., IC device 410) as described herein. In further implementations, another component (e.g., memory device or other integrated circuit device) housed within the computing device 600 may contain a die (e.g., die 102 of FIG. 1, die 202a of FIG. 2, and/or die 202b of FIG. 2) having an IC device (e.g., IC device 410) as described herein.

In various implementations, the computing device 600 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some non-limiting Examples are provided below.

Example 1 is a method for revealing a backside of an integrated circuit device, the method comprising: removing a portion of a semiconductor substrate that is coupled to a backside of an integrated circuit (IC) device to leave a remaining portion of the semiconductor substrate coupled to the backside of the IC device; and removing, by chemical mechanical planarization (CMP) using a selective slurry, the remaining portion of the semiconductor substrate to expose the backside of the IC device.

Example 2 is the method of Example 1, wherein removing the portion of the semiconductor substrate includes: removing a first portion of the semiconductor substrate by mechanical grinding; and removing a second portion of the semiconductor substrate by wet etch.

Example 3 is the method of Example 1, wherein the portion of the semiconductor substrate is removed by CMP, grinding, or wet etch.

Example 4 is the method of Example 1, further comprising generating one or more vias in the backside of the IC device to provide access to one or more layers of the IC device.

Example 5 is the method of Example 1, wherein the backside of the IC device includes an isolation oxide.

Example 6 is the method of Example 5, wherein the semiconductor substrate is silicon, and wherein the selective slurry is selective for silicon compared with the isolation oxide.

Example 7 is the method of Example 5, wherein the isolation oxide is an insulator layer of a silicon-on-insulator (SOI) wafer.

Example 8 is the method of any one of Examples 1 to 6, wherein the IC device further includes a plurality of semiconductor fins extending into the IC device from the backside of the device.

Example 9 is the method of Example 8, further comprising recessing the semiconductor fins from the backside of the device by etching the semiconductor fins.

Example 10 is the method of Example 1, wherein the removing the portion and the removing the remaining portion are performed on a wafer that includes the semiconductor substrate coupled to a plurality of IC devices including the IC device, and wherein the method further comprises bonding a top side of the IC device, opposite the backside, to a carrier wafer prior to the removing the portion and the removing the remaining portion.

Example 11 is the method of Example 1, wherein the removing the remaining portion of the semiconductor substrate by CMP further includes removing a portion of a semiconductor fin of the IC device on the backside of the IC device such that the semiconductor fin has a recessed surface relative to the backside of the IC device.

Example 12 is an integrated circuit comprising: an isolation oxide including a surface that defines a backside of the integrated circuit, wherein the surface of the isolation oxide is not bonded to a semiconductor substrate; a plurality of semiconductor regions extending from the backside of the integrated circuit into a body of the integrated circuit, wherein the plurality of semiconductor regions are formed of a semiconductor material; and one or more transistor layers coupled to one or more semiconductor regions of the plurality of semiconductor regions to form one or more transistors.

Example 13 is the integrated circuit of Example 12, further comprising one or more vias disposed in the isolation oxide and extending into the body of the integrated circuit from the backside of the integrated circuit.

Example 14 is the integrated circuit of Example 13, further comprising: a top side opposite the backside; and a plurality of vias extending into the body of the integrated circuit from the top side of the integrated circuit.

Example 15 is the integrated circuit of Example 13, further comprising an interconnect layer coupled to the backside of the integrated circuit to route signals to or from the vias.

Example 16 is the integrated circuit of any one of Examples 12 to 15, wherein the semiconductor regions are semiconductor fins and the one or more transistors are fin field-effect transistors (finFETs).

Example 17 is the integrated circuit of Example 16, wherein the semiconductor fins are recessed from the surface of the isolation oxide on the backside of the integrated circuit.

Example 18 is the integrated circuit of any one of Examples 12 to 15, wherein the isolation oxide forms shallow trench isolations (STIs), and the semiconductor regions are doped semiconductor wells.

Example 19 is a computing device comprising: a circuit board; and a die coupled with the circuit board on a front side of the die. The die of Example 19 includes: a plurality of fins extending from a backside of the die into a device layer of the die, wherein the plurality of fins are formed of a semiconductor material, and wherein the backside of the die does not include a semiconductor substrate on the backside that connects the fins; one or more transistor layers disposed in the device layer and coupled to one or more fins of the plurality of fins to form one or more transistors; and one or more backside vias extending to the device layer of the die from the backside of the die.

Example 20 is the computing device of Example 19, wherein the die is a first die, and wherein the computing device further comprises a second die coupled to the one or more backside vias of the first die.

Example 21 is the computing device of Example 19, wherein the die further includes an isolation oxide disposed between fins of the plurality of fins on the backside of the die.

Example 22 is the computing device of Example 19, wherein the die further includes: a plurality of top side vias extending to the device layer of the die from the top side of the die.

Example 23 is the computing device of Example 19, wherein the plurality of fins have a dished surface at or near the backside of the integrated circuit.

Example 24 is the computing device of Example 19, wherein the semiconductor material includes silicon.

Example 25 is the computing device of any one of Examples 19 to 24, wherein: the die is a processor; and the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit comprising:
   an isolation oxide including a surface that defines a backside of the integrated circuit, wherein the surface of the isolation oxide is not bonded to a semiconductor substrate;
   a plurality of semiconductor regions extending from the backside of the integrated circuit into a body of the integrated circuit, wherein the plurality of semiconductor regions are formed of a semiconductor material;
   one or more transistor layers coupled to one or more semiconductor regions of the plurality of semiconductor regions to form one or more transistors;
   one or more vias disposed in the isolation oxide and extending into the body of the integrated circuit from the backside of the integrated circuit; and
   an interconnect layer coupled to the backside of the integrated circuit to route signals to or from the one or more transistors via the one or more vias, wherein there is no semiconductor substrate between the interconnect layer and the isolation oxide.

2. The integrated circuit of claim 1, further comprising:
   a top side opposite the backside; and
   a plurality of vias extending into the body of the integrated circuit from the top side of the integrated circuit.

3. The integrated circuit of claim 1, wherein the plurality of semiconductor regions are semiconductor fins and the one or more transistors are fin field-effect transistors (finFETs).

4. The integrated circuit of claim 3, wherein the semiconductor fins are recessed from the surface of the isolation oxide on the backside of the integrated circuit.

5. The integrated circuit of claim 1, wherein the isolation oxide forms shallow trench isolations (STIs), and the plurality of semiconductor regions are doped semiconductor wells.

6. An integrated circuit comprising:
   an isolation oxide including a surface that defines a backside of the integrated circuit, wherein the surface of the isolation oxide is not bonded to a semiconductor substrate;
   a plurality of semiconductor fins extending from the backside of the integrated circuit into a body of the integrated circuit, wherein the plurality of semiconductor fins are formed of a semiconductor material, and wherein the plurality of semiconductor fins are recessed from the surface of the isolation oxide on the backside of the integrated circuit; and
   one or more transistor layers coupled to one or more semiconductor fins of the plurality of semiconductor fins to form one or more fin field-effect transistors (finFETs).

7. The integrated circuit of claim 6, further comprising one or more vias disposed in the isolation oxide and extending into the body of the integrated circuit from the backside of the integrated circuit.

8. The integrated circuit of claim 7, further comprising:
   a top side opposite the backside; and
   a plurality of vias extending into the body of the integrated circuit from the top side of the integrated circuit.

9. The integrated circuit of claim 7, further comprising an interconnect layer coupled to the backside of the integrated circuit to route signals to or from the one or more FinFETs via the one or more vias.

* * * * *